United States Patent [19]

Giacomelli

[11] 4,441,808

[45] Apr. 10, 1984

[54] FOCUSING DEVICE FOR PHOTO-EXPOSURE SYSTEM

[75] Inventor: Thomas P. Giacomelli, Simi, Calif.

[73] Assignee: TRE Semiconductor Equipment Corp., Woodland Hills, Calif.

[21] Appl. No.: 441,648

[22] Filed: Nov. 15, 1982

[51] Int. Cl.³ .............................................. G03B 27/42
[52] U.S. Cl. ...................................... 355/53; 355/73; 355/76
[58] Field of Search ............................. 355/53, 73, 76

[56] References Cited

U.S. PATENT DOCUMENTS

| | | | |
|---|---|---|---|
| 3,722,996 | 3/1973 | Fox | 355/53 |
| 4,084,903 | 4/1978 | Pircher | 355/53 |
| 4,155,642 | 5/1979 | Lacombat | 355/53 |
| 4,298,273 | 11/1981 | Nishizuka et al. | 355/53 |

*Primary Examiner*—Monroe H. Hayes
*Attorney, Agent, or Firm*—Spensley, Horn, Jubas & Lubitz

[57] ABSTRACT

A focusing apparatus for use in a step and repeat photo-exposure system is provided in which air jets are located immediately adjacent the exposure area of the exposure system. Back pressure of the air jets is sensed to determine the distance of the optical unit of the photo-exposure system to the surface of a semiconductor wafer being exposed. The average back-pressure is utilized to control movement of the optical system in order to achieve precise focusing. A map of the surface aberration of the wafer may be obtained by measuring the position of the camera at each die site after focusing has been achieved.

4 Claims, 4 Drawing Figures

U.S. Patent     Apr. 10, 1984     4,441,808
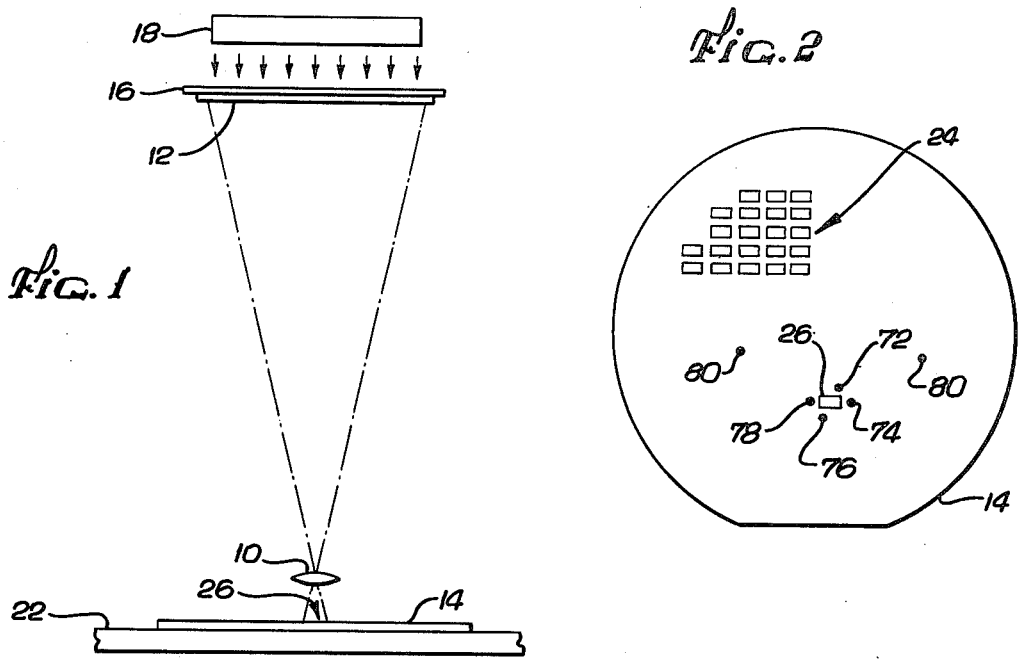
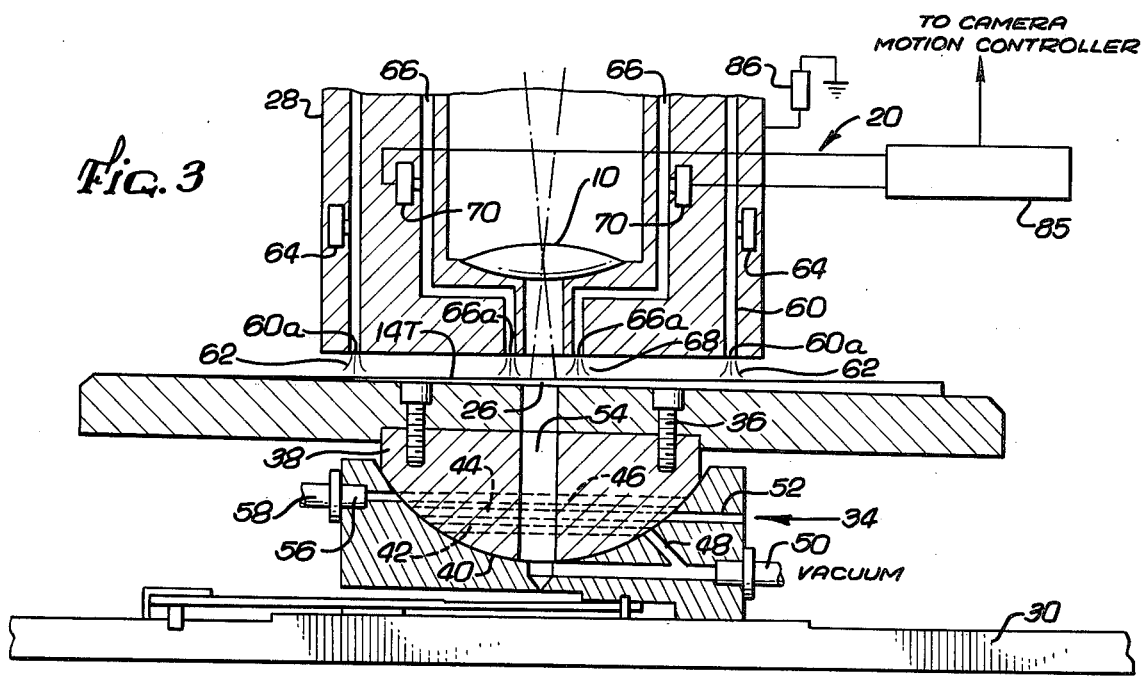
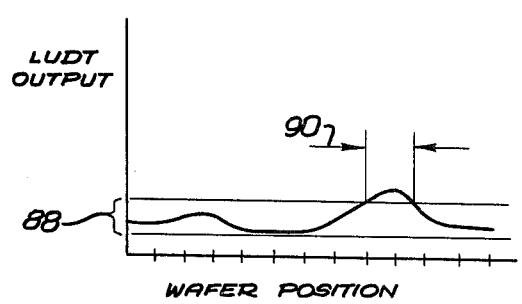

FOCUSING DEVICE FOR PHOTO-EXPOSURE SYSTEM

BACKGROUND OF THE INVENTION

1. Field of the Invention

This invention relates to photo-exposure systems which are used to produce semiconductor devices. These systems operate by successively exposing circuit patterns in an overlapping fashion onto a semiconductor wafer. More particularly, the present invention relates to a step and repeat photo-exposure system in which a pattern which is contained on an exposure mask is exposed by a camera onto a semiconductor wafar in a reduced fashion. The wafer is stepped and repeated in order to position different die sites beneath the camera of the photo-exposure system. The step and repeat operation continues until all of the die sites on the wafer have been exposed. A new mask is then used to expose a second circuit pattern in an overlapping relation to the intial circuit pattern formed at each die site.

Typically, several hundred individual dies may be formed on a single wafer. In order to insure that the integrated circuits formed by means of the exposure of overlapping circuit patterns operates properly, it is critical to expose the successive patterns in precise overlapping alignment. During the exposure process, an image of the circuit pattern on the exposure mask is formed on the wafer by means of a reduction lens system. If fine alignment and high resolution are to be achieved, the image which is formed by the reduction lens must be precisely focused. The present invention is directed to a system for achieving such precise focus.

2. Description of the Prior Art

In order to achieve precise focus, it is necessary to maintain the surface of the wafer a predetermined exact distance from the reduction lens. If the wafer were precisely flat, this requirement would not present any significant problems. However, wafers may not be precisely flat, i.e., they may be very slightly wedge shaped. In addition, a wafer undergoes process steps in between each circuit pattern exposure, and such process steps may cause the wafer to warp, thus causing its surface to be uneven. The variation in the flatness of the surface of the wafer is generally extremely small; however, because of the very small dimensions of the elements of the circuit patterns, even minute variations in focus caused by a lack of flatness can adversely effect the operation of the system.

One method of achieving exact focus is disclosed in U.S. patent application Ser. No. 038,349, filed on May 11, 1979, entitled "SINGLE LENS REPEATER" and assigned to TRE Corporation, the same assignee as the present invention. In this system, an air jet leveling and focusing system is utilized. The device utlizes a plurality of air jets, typically three, located in the camera housing which carries the reduction lens. The semiconductor wafer is carried on a table which is supported by means of a spherical air bearing, and the air jets supply air under pressure to the surface of the wafer to exert a force on the wafer and the underlying platform. If the wafer surface is not parallel with the housing from which the air jets emanate, the force exerted on the wafer by the individual air jets will not be equal. The unequal force causes the wafer and platform to move with respect to the spherical air bearing support until a condition of equilibrium is achieved. The pressure from the jets causes the surface of the wafer to become parallel to the lower surface of the housing which contains the reduction lens.

The air jets which are used to achieve the leveling of the semiconductor wafer are also used to determine the focus of the system. To this end, the housing containing the reduction lens is moved toward the wafer while monitoring the back-pressure level resulting from the air jets. When the back-pressure reaches a predetermined level, the lens is in the desired position to achieve correct focus.

In order to provide the leveling function, the air jets must be spaced from each other by a sufficient amount to exert a force which will cause the support platform to move within the spherical air bearing. Because of this requirement, the air jets are separated from the exposure location of the camera. As a result of this separation, exact focus may not be achieved despite the detection of the desired back-pressure of the air jets. This is due to the fact that variations in the surface flatness of the wafer may result in the exposure location being at a different distance from the camera than are the air jets. Furthermore, even the small area of the exposure location itself may be warped, and the system described above does not take such warpage into account.

SUMMARY OF THE INVENTION

It is a primary object of the present invention to provide more accurate focusing than has previously been achieved. This is accomplished by providing a system in which separate groups of air jets are provided for the purpose of achieving leveling and focusing. The air jets used to accomplish leveling are separated from each other by a relatively large amount to thereby enable them to provide the required leveling force. One or more additional air jets is provided very close to the exposure location in order to achieve precise focusing. The back-pressure of the air jets is sensed in order to determine the distance from the camera to the wafer surface immediately adjacent the exposure location. A more precise measurement of the distance between the camera and the exposure location is thus achieved.

In order to further increase the accuracy of the system, a plurality of air jets may be provided immediately adjacent the exposure locations. Focusing is accomplished by moving the camera body until the average back-pressure sensed at the jets is equal to a predetermined amount. Variations in the flatness of the exposure location itself are thus averaged out and the most accurate focus is achieved. If the measurement obtained from one of the jets is radically different from the remaining measurements, it can be ignored in the averaging process.

BRIEF DESCRIPTION OF THE DRAWINGS

The invention will now be described with reference to the drawings, wherein:

FIG. 1 is a diagrammatic plan view of the exposure system of a step and repeat apparatus;

FIG. 2 is a top plan view of a semiconductor wafer showing a number of die sites on the wafer; and FIG. 3 is a plan view of the focusing system of the present invention.

FIG. 4 is a diagram of a surface map of a wafer obtained using the present invention.

DESCRIPTION OF THE PREFERRED EMBODIMENT

The following description is of the best presently contemplated mode of carrying out the invention. This description is made for the purpose of illustration and is not to be taken in a limiting sense. The scope of the invention is best determined by the appended claims.

Referring to FIG. 1, a step and repeat photo-exposure system includes a camera having a reduction lens system 10 which is used to project an image of a circuit pattern contained on a mask 12 onto a semiconductor wafer 14. Typically, the lens 10 has a ten-to-one reduction ratio, i.e., the mask pattern is ten times the size of the pattern projected onto the wafer 14. The mask 12 is carried by a mask holder 16, and exposure is achieved by flashing a flash lamp 18. The lamp 18 and lens 10 together comprise the camera 20 of the exposure system.

The semiconductor wafer is carried on a platform 22 which is movable in a step and repeat fashion. The remainder of the step and repeat apparatus (not shown) is well known and need not be described in detail.

FIG. 2 shows the semiconductor wafer 14. The wafer includes a plurality of circuit patterns 24 formed on its surface. A typical semiconductor wafer may include several hundred such circuit patterns. These patterns are formed in an array of rows and columns by stepping and repeating the platform 22 so that each die site is sequentially positioned in an exposure area 26 indicated in FIG. 1.

Referring now to FIG. 3, the camera system including the lens 10 is carried within a housing 28. The camera has a very shallow depth of focus, and in order to achieve the maximum precision in the imaging of the circuit pattern on the mask 12 onto the wafer surface, it is critical that the portion of the wafer within the exposure area 26 be a precise distance from the camera optics. Several problems may prevent such exact focus from being achieved. First, the wafer itself may have a wedge-shaped cross section (indicated in an exaggerated fashion in FIG. 3) due to the difficulty of forming the wafer so as to have the same thickness throughout. Secondly, the wafer is subjected to various processing steps between each circuit pattern exposure. These processing steps typically involve heating the wafer, with the result being that the wafer may become warped. This warpage may be on a large scale (e.g., the wafer may become dish shaped when subjected to processing) or on a small scale (e.g., the surface of the wafer may become rippled). In either event, different sections of the wafer surface will be spaced from the camera by different amounts.

The step and repeat system includes a movable table 30 which is driven along X and Y axes by a conventional drive system (not shown). Mounted to the table 30 is a stationary base 32 of a spherical air bearing support 34 for the platform 22. The platform 22 is attached by bolts 36 to a generally hemispherical bearing 38 that sits within the hemispherical, concave upper surface 40 of the base 32. The wafer 14 being exposed is held by a vacuum force to the top of the platform 22.

A series of annualar grooves 42, 44 and 46 are formed on the surface 40 of the bearing. The groove 42 communicates via a channel 48 in the base 32 to a connector 50 that is connected to a vacuum. The groove 44 is vented to atmospheric pressure via a vent channel 52 through the base 32. With this arrangement, a vacuum applied to the connector 50 will cause the bearing 38 to be held firmly in place with respect to the base 32. The vacuum channel 50 also communicates via a channel 54 through the bearing 38 and the platform 22 to one or more openings on the upper surface of the platform beneath the wafer 14. With this arrangement, the same vacuum applied to the connector 50 also will hold the wafer 14 firmly in place atop the platform 22. An alternative design may have the wafer holding vacuum supplied separately from that used to clamp the two halves of the air bearing.

The groove 46 communicates via channel 56 to a connector 58 that is attached to a source of air or other gas under positive pressure. Normally, a vacuum is continuously provided at the connector 50. When it is necessary to change the orientation of the platform 22, gas under pressure is supplied to the connector 58. The pressure of this gas, applied via the groove 56 to the inner surface 40 of the base 32, overcomes the holding force of the vacuum and forms an air support for the bearing 38. As a result, the bearing 38 and the platform 22 can be positioned with respect to the base 32 by the application of a very small force to the platform 22 or the wafer 14. When the desired platform orientation is achieved, the pressurized gas is disconnected from the connector 58 and the vacuum immediately locks the bearing 38 in place with respect to the base 32.

The air bearing support mechanism is used to facilitate parallel alignment of the top surface of the wafer 14 with a reference plane such as the plane of the lower end 28-L of the camera housing 28. To this end, contained within the housing 28 are a plurality (typically three) of air ducts 60. These air ducts are spaced around the periphery of the housing 28, for example at 120° intervals. A source of air or other gas under pressure (not shown) is connected to the upper ends of the ducts 60. Air escapes via the open lower ends 60-A so as to form a set of air jets 62. The pressure of the air in each of the ducts may be sensed by a corresponding pressure sensor 64 contained within the housing 28.

To accomplish parallel alignment of the wafer 14, air under pressure is applied to the connector 58 so that the platform 22 and wafer 14 are free to move on the spherical air bearing support 38. The camera body 28 is then lowered toward the wafer 14, with air under pressure supplied to the ducts 60. The resultant air jet 62 exerts a force on the wafer 14 and the platform 22. If the wafer surface is not parallel with the lower surface 28-L of the housing, the force exerted by the individual air jets 60 will not be equal. As a result, the unequal forces will cause the wafer 14 and platform 22 to move with respect to the spherical air bearing support 38 until a condition of equilibrium is achieved at which the force exerted by all of the air jets 62 is equal. This will occur when the spacing between each of the duct openings 60a and the surface of the wafer 14 are equal, i.e., it will occur when the wafer top surface is parallel to the housing bottom 28-L. This condition is sensed by the occurrence of equal back-pressure at all of the sensors 64. Appropriate control circuitry (not shown) responsive to this equal back-pressure condition causes the supply of pressurized air to the connector 58 to be turned off. As a result, the bearing 38 will immediately be locked by vacuum to the base 32, thereby rigidly holding the platform 22 and wafer 14 in the desired position with the upper surface of the wafer parallel to the camera bottom 28-L.

In the prior art system, the jets 62 or a similarly utilized series of jets at different physical locations are used to accomplish focusing of the camera once parallel alignment has been achieved. The present invention provides a further increase in the accuracy of the focusing operation as compared to the prior art system.

In the present invention, an additional set of air ducts 66 is provided within the camera housing 28. These ducts are located so that they have openings 66a which form air jets 68 which are immediately adjacent the exposure location 26 of the optics 10. A pressure sensor 70 is associated with each duct 66 to monitor the back-pressure therein. In order to focus the camera, the camera body is gradually lowered toward the wafer while the back-pressure level detected by the sensors 70 is monitored. When the predetermined pressure corresponding to the distance of exact focus is detected, downward movement of the camera body is stopped. By providing the air jets immediately adjacent the exposure area 26, inaccuracies in the focusing caused by minute variations in the flatness of the upper surface of the wafer 14 are largely eliminated. In contrast, if the jets 62 were utilized for the focusing operation, the portion of the wafer surface which they strike may be at a different level than the exposure area 26 and the focusing may be in error.

The provision of an air jet immediately adjacent the exposure area facilitates extremely accurate focusing. The accuracy of this focusing may be even further increased by providing multiple air jets immediately adjacent the exposure area and focusing the camera based upon the average back-pressure sensed in each of the ducts of the corresponding air jet. Such an operation results in most accurate focusing despite the fact that even the small area of the exposure area 26 may have surface irregularities. Referring again to FIG. 2, four air jets may be used to surround an exposure area 26. The air jets will strike points 72-78. By utilizing the average back-pressure produced by each of the jets, extremely accurate focusing may be achieved. If the jets 62 were utilized, they would strike points 80-84. The focusing operation may be in error due to the fact that substantial surface irregularities may exist between the points 80-84 and the exposure area 26.

The averaging calculation is accomplished by means of a microcomputer 85. The computer receives binary inputs representing the back pressure sensed at each air jet location, and provides an average as its output. The microcomputer program is such that if one of the jet readings is radically different from the remaining readings (such as would occur if one of the jets went off the edge of the wafer), that reading will be ignored. In this manner precise distance determinations can still be achieved despite the fact that one of the jets is essentially inoperative. Furthermore, since the expected distance readings are known, the system can be programmed to operate based on the reading from a single jet in the event that the readings from the remaining jets indicate that they are not given valid data for focusing.

Referring again to FIG. 3, attached to the camera housing 28 is a linear voltage differential transducer (LVDT) 86. The LVDT 86 is used to provide a signal indicating the current vertical position of the camera. As the camera is focused at each die site, the output of the LVDT may vary. By keeping a record of the LVDT output, a very accurate report is obtained of the surface aberrations of the wafer being exposed. This surface "map" will be extremely accurate due to the accurate focusing which is achieved by the provision of the air ducts immediately adjacent the exposure area. A graph of the surface contours of a wafer for one dimension is shown in FIG. 4. As long as the LVDT measurements remain within the range indicated at 86, the circuits formed will function properly. However, readings outside of the range 88, such as the space 90 on the wafer, indicate that the warpage of the wafer is too great and that the circuits formed within that area will not be useable. The LVDT readings can therefore be used to automatically reject circuits formed in overly warped areas of the wafer.

I claim:

1. An apparatus useful in a step and repeat semiconductor wafer photo-exposure system of the type having a camera for sequentially exposing different areas on said wafer to produce semiconductor devices, said apparatus achieving spaced parallel alignment of the surface of said semiconductor wafer with a reference plane that is associated with the body of the camera of said system and is in spaced facing relationship with said wafer surface, comprising:

a platform for supporting said wafer;

a spherical air bearing mounting for said platform;

a plurality of first channels in said camera body for conducting gas under pressure to first openings in said camera body facing said wafer surface so as to form gas jets directed toward said semiconductor wafer;

first pressure sensors associated with each of sad channels to sense the gas back-pressure therewithin, means for applying gas via said channels so that the force of said gas jets applied against said wafer will cause said wafer and said platform to move within said air bearing mounting until the back-pressure condition indicating that the distance from each of said openings to said wafer surface is equal, whereby said parallel alignment between said semiconductor wafer and the reference plane of said camera body is achieved;

vacuum clamping means for locking with said spherical air bearing mounting to prevent further movement of said platform therewithin, said vacuum clamping means being actuated upon detection by said sensors of said equal back-pressure condition;

a plurality of second channels in said camera body for conducting gas under pressure to second openings in the camera body facing said wafer surface so as to form gas jets directed toward said semiconductor wafer, wherein the second openings are located so that the gas jets strike the semiconductor wafer adjacent the exposure field of the camera;

second pressure sensors associated with each of said second channels to sense the gas back-pressure therewithin;

means for moving said camera body toward and away from said semiconductor wafer; and focusing means for causing said moving means to move said body relative to said wafer until the average level of back-pressure sensed at all of the said second sensors is equal to a predetermined value, said value corresponding to a spacing between said body end and said wafer at which said camera is most accurately focused on said surface.

2. The apparatus of claim 1 wherein there are four second openings which are located on the camera body to form gas jets which surround the exposure field of the camera.

3. The apparatus of claim 1 including means for measuring the position of the camera body with respect to a reference position and means for storing a position measurement after the camera has been focused at each exposure location, whereby a record of the surface characteristics of the wafer is obtained.

4. The apparatus of claim 3 wherein the means for measuring comprises a linear voltage differential transducer attached to the camera body.

* * * * *